United States Patent
Alschinger et al.

(10) Patent No.: US 9,922,621 B2
(45) Date of Patent: Mar. 20, 2018

(54) DEVICE FOR GENERATING A DISPLAY IMAGE ON A COMPOSITE GLASS PANE

(75) Inventors: Matthias Alschinger, Compiegne (FR); Michael Labrot, Aachen (DE); Philippe Letocart, Raeren (BE); Bianca Bergs, Feilenkirchen (DE); Monique Elmer, Emsdetten (DE); Jean-Yves Laluet, Paris (FR); Guillaume Lecamp, Paris (FR); Marcus Neander, Eschweiler (DE)

(73) Assignee: SEKISUI CHEMICAL CO., LTD., Osaka (JP)

( * ) Notice: Subject to any disclaimer, the term of this patent is extended or adjusted under 35 U.S.C. 154(b) by 954 days.

(21) Appl. No.: 14/131,680

(22) PCT Filed: Jul. 26, 2012

(86) PCT No.: PCT/EP2012/064666
§ 371 (c)(1),
(2), (4) Date: Apr. 24, 2014

(87) PCT Pub. No.: WO2013/029888
PCT Pub. Date: Mar. 7, 2013

(65) Prior Publication Data
US 2014/0232707 A1    Aug. 21, 2014

(30) Foreign Application Priority Data
Aug. 29, 2011  (EP) .................................... 11179154

(51) Int. Cl.
*G03B 21/14*   (2006.01)
*G09G 5/10*    (2006.01)
(Continued)

(52) U.S. Cl.
CPC ......... *G09G 5/10* (2013.01); *B32B 17/10036* (2013.01); *B32B 17/10669* (2013.01);
(Continued)

(58) Field of Classification Search
CPC .............. G03B 21/204; G03B 21/2053; G03B 21/2086
(Continued)

(56) References Cited

U.S. PATENT DOCUMENTS

| 2,490,662 A | 12/1949 | Thomsen |
| 5,549,786 A | 8/1996 | Jones et al. |

(Continued)

FOREIGN PATENT DOCUMENTS

| CN | 1464884 A | 12/2003 |
| CN | 101302301 A | 11/2008 |

(Continued)

OTHER PUBLICATIONS

PCT International Search Report dated Oct. 5, 2012 for PCT/EP2012/064666 filed on Jul. 26, 2012 in the name of Saint-Gobain Glass France.
(Continued)

*Primary Examiner* — William C Dowling
(74) *Attorney, Agent, or Firm* — Cheng Law Group, PLLC (57) ABSTRACT

A device for generating a display image on a composite glass pane is described. The device has: a composite glass pane with a first pane and a second pane, which are connected to each other via an intermediate layer that contains at least one luminescent pigment; a laser projector, which contains at least one laser and an optical system for deflecting a radiation of the laser, the radiation being directed within a region of the composite glass pane; a photodetector, which detects luminescent radiation of the luminescent pigment; and a control unit, which electronically connects the photodetector and the laser projector.

19 Claims, 4 Drawing Sheets

(51) Int. Cl.

| | | |
|---|---|---|
| *G03B 21/20* | (2006.01) | |
| *G02B 1/04* | (2006.01) | |
| *G02B 5/22* | (2006.01) | |
| *G02B 26/08* | (2006.01) | |
| *G02B 26/10* | (2006.01) | |
| *G03B 21/60* | (2014.01) | |
| *G02B 27/01* | (2006.01) | |
| *B32B 17/10* | (2006.01) | |
| *G02B 5/30* | (2006.01) | |
| *H01S 5/00* | (2006.01) | |
| *H01S 5/068* | (2006.01) | |

(52) U.S. Cl.
CPC .............. *G02B 1/04* (2013.01); *G02B 5/223* (2013.01); *G02B 26/0841* (2013.01); *G02B 26/101* (2013.01); *G02B 27/0101* (2013.01); *G03B 21/204* (2013.01); *G03B 21/2033* (2013.01); *G03B 21/2053* (2013.01); *G03B 21/2086* (2013.01); *G03B 21/60* (2013.01); *G02B 5/30* (2013.01); *G02B 2027/0123* (2013.01); *H01S 5/005* (2013.01); *H01S 5/06825* (2013.01)

(58) Field of Classification Search
USPC ...................................................... 353/12, 13
See application file for complete search history.

(56) References Cited

U.S. PATENT DOCUMENTS

| | | | |
|---|---|---|---|
| 5,573,842 A | 11/1996 | Gutweiler | |
| 6,002,505 A | 12/1999 | Kraenert et al. | |
| 6,072,686 A * | 6/2000 | Yarbrough | H01P 1/127 200/181 |
| 6,670,603 B2 * | 12/2003 | Shimada | G03B 21/008 250/235 |
| 6,708,595 B1 | 3/2004 | Chaussade et al. | |
| 6,879,499 B2 * | 4/2005 | Matsumoto | H02M 3/335 363/21.06 |
| 7,012,746 B2 | 3/2006 | Bermel | |
| 7,090,355 B2 | 8/2006 | Liu et al. | |
| 7,230,767 B2 | 6/2007 | Walck et al. | |
| 7,261,842 B2 | 8/2007 | Henry et al. | |
| 8,072,686 B2 * | 12/2011 | Cui | G01S 13/723 359/630 |
| 8,339,332 B2 * | 12/2012 | Kanou | B32B 17/10036 345/7 |
| 8,487,277 B2 | 7/2013 | Labrot et al. | |
| 8,519,362 B2 | 8/2013 | Labrot et al. | |
| 8,722,195 B2 | 5/2014 | Labrot | |
| 2001/0005262 A1 | 6/2001 | Tsurushima | |
| 2001/0041251 A1 | 11/2001 | Bravet et al. | |
| 2002/0120916 A1 * | 8/2002 | Snider, Jr. | B32B 17/10036 717/100 |
| 2003/0166788 A1 | 9/2003 | Papenfuhs | |
| 2003/0193044 A1 | 10/2003 | Henry et al. | |
| 2005/0007562 A1 | 1/2005 | Seki et al. | |
| 2005/0074591 A1 | 4/2005 | Zagdoun | |
| 2005/0077647 A1 | 4/2005 | Coyle et al. | |
| 2006/0065735 A1 | 3/2006 | Li et al. | |
| 2006/0153558 A1 | 7/2006 | Tan et al. | |
| 2006/0171007 A1 | 8/2006 | Chen et al. | |
| 2006/0221021 A1 | 10/2006 | Hajjar et al. | |
| 2006/0221022 A1 | 10/2006 | Hajjar | |
| 2006/0227087 A1 | 10/2006 | Hajjar et al. | |
| 2006/0244925 A1 | 11/2006 | Seki et al. | |
| 2007/0014318 A1 | 1/2007 | Hajjar et al. | |
| 2007/0046176 A1 | 3/2007 | Bukesov et al. | |
| 2007/0187616 A1 | 8/2007 | Burroughs et al. | |
| 2007/0188417 A1 | 8/2007 | Hajjar et al. | |
| 2007/0206258 A1 | 9/2007 | Malyak et al. | |
| 2007/0228927 A1 | 10/2007 | Kindler et al. | |
| 2008/0203901 A1 | 8/2008 | Bukesov et al. | |
| 2008/0231738 A1 | 9/2008 | Iida | |
| 2008/0259431 A1 * | 10/2008 | Weichmann | H04N 9/3129 359/237 |
| 2008/0291140 A1 | 11/2008 | Kent et al. | |
| 2008/0318063 A1 | 12/2008 | Anderson | |
| 2009/0033884 A1 | 2/2009 | Yonekubo et al. | |
| 2009/0115100 A1 | 5/2009 | Nakai et al. | |
| 2009/0141496 A1 | 6/2009 | Yamamoto et al. | |
| 2009/0153582 A1 | 6/2009 | Hajjar et al. | |
| 2009/0174632 A1 | 7/2009 | Hajjar et al. | |
| 2010/0063176 A1 | 3/2010 | Kato et al. | |
| 2010/0243858 A1 * | 9/2010 | Newman | G02B 27/01 250/201.1 |
| 2010/0253600 A1 | 10/2010 | Seder et al. | |
| 2011/0073773 A1 * | 3/2011 | Labrot | B32B 17/10 250/461.1 |
| 2011/0074660 A1 | 3/2011 | Hajjar et al. | |
| 2011/0076473 A1 | 3/2011 | Lin et al. | |
| 2011/0109529 A1 | 5/2011 | Hajjar et al. | |
| 2011/0141150 A1 | 6/2011 | Hajjar et al. | |
| 2011/0164158 A1 | 7/2011 | Iida | |
| 2011/0176208 A1 | 7/2011 | Kindler et al. | |
| 2011/0181948 A1 | 7/2011 | Kindler et al. | |
| 2011/0291554 A1 | 12/2011 | Bukesov et al. | |
| 2012/0068083 A1 | 3/2012 | Labrot et al. | |
| 2012/0299328 A1 * | 11/2012 | Labrot | B32B 17/10036 296/84.1 |
| 2014/0218803 A1 | 8/2014 | Labrot et al. | |
| 2014/0232707 A1 | 8/2014 | Alschinger et al. | |
| 2016/0011414 A1 * | 1/2016 | Joseph | G02B 1/10 359/609 |

FOREIGN PATENT DOCUMENTS

| | | |
|---|---|---|
| DE | 822714 | 11/1951 |
| DE | 40 24 330 A1 | 2/1992 |
| DE | 19918811 | 11/2000 |
| DE | 100 02 152 A1 | 7/2001 |
| DE | 10350529 | 3/2005 |
| DE | 10 2005 061 855 A1 | 7/2007 |
| DE | 603 14 613 T2 | 3/2008 |
| DE | 102009044181 | 7/2011 |
| EP | 0 157 030 A1 | 10/1985 |
| EP | 0 597 391 A1 | 5/1994 |
| EP | 0734852 | 10/1996 |
| EP | 0 990 941 A2 | 4/2000 |
| EP | 2 110 237 A1 | 10/2009 |
| EP | 2233962 | 9/2010 |
| FR | 2 929 017 A1 | 9/2009 |
| FR | 2929016 | 9/2009 |
| GB | 2424382 | 9/2006 |
| JP | 7-149988 A | 6/1995 |
| JP | 9-327898 A | 12/1997 |
| JP | 10-119110 A | 5/1998 |
| JP | 2000-168352 A | 6/2000 |
| JP | 2001-113588 A | 4/2001 |
| JP | 2001-249399 A | 9/2001 |
| JP | 2002-241371 A | 8/2002 |
| JP | 2003-29201 A | 1/2003 |
| JP | 2003-340851 A | 12/2003 |
| JP | 2004-341210 A | 12/2004 |
| JP | 2007-1122 A | 1/2007 |
| JP | 2007-527548 A | 9/2007 |
| JP | 2008-235681 A | 10/2008 |
| JP | 2008-260498 A | 10/2008 |
| JP | 2009-510536 A | 3/2009 |
| JP | 2009-86182 A | 4/2009 |
| JP | 2009-139940 A | 6/2009 |
| JP | 2009145846 | 7/2009 |
| JP | 2009-539120 A | 11/2009 |
| JP | 2010-243940 A | 10/2010 |
| JP | 2010-271443 A | 12/2010 |
| KR | 10-1999-0071481 A | 9/1999 |
| KR | 2000-0068557 A | 11/2000 |
| KR | 10-2005-0066398 A | 6/2005 |
| WO | WO-01/94496 A1 | 12/2001 |
| WO | WO-2004/099172 A1 | 11/2004 |
| WO | 2007/039850 | 4/2007 |

(56) References Cited

FOREIGN PATENT DOCUMENTS

| WO | WO-2008/132368 A2 | 11/2008 |
|---|---|---|
| WO | WO-2010/139889 A1 | 12/2010 |
| WO | WO-2011/042384 A1 | 4/2011 |

OTHER PUBLICATIONS

Day, M. et al., "Photochemical Degradation of Poly(ethylene Terephthalate). I. Irradiation Experiments with the Xenon and Carbon Arc," Journal of Applied Polymer Science, 1972, vol. 16, pp. 175-189.
Edge, M. et al., "Identification of luminescent species contributing to the yellowing of poly(ethylene terephthalate) on degradation", Polymer, 1995, vol. 36, No. 2, pp. 227-234.
International Search Report for the Application No. PCT/EP2010/064734 dated Jan. 19, 2011.
Written Opinion of the International Searching Authority (PCT/ISA/237) for Application No. PCT/EP2010/064734 dated Jan. 19, 2011.
Non-Final Office Action for the U.S. Appl. No. 13/499,235 from the United States Patent and Trademark Office dated Oct. 1, 2013.
Notice of Allowance for the U.S. Appl. No. 13/499,235 from the United States Patent and Trademark Office dated Mar. 14, 2014.
international Search Report for the Application No. PCT/EP2011/064354 dated Nov. 3, 2011.
Written Opinion of the International Searching Authority (PCT/ISA/237) for Application No. PCT/EP2011/064354 dated Nov. 3, 2011.
Written Opinion of the International Searching Authority (PCT/ISA/237) for Application No. PCT/EP2012/052338 dated Nov. 5, 2012.
International Search Report for the Application No. PCT/EP2012/052338 dated Nov. 5, 2012.
Non-Final Office Action for the U.S. Appl. No. 14/110,916 from the United States Patent and Trademark Office dated Nov. 12, 2015.
Final Office Action for the U.S. Appl. No. 14/110,916 from the United States Patent and Trademark Office dated May 13, 2016.
Notice of Allowance for the U.S. Appl. No. 14/110,916 from the United States Patent and Trademark Office dated Jan. 4, 2017.
PCT Written Opinion dated Oct. 5, 2012 for PCT/EP2012/064666 filed on Jul. 26, 2012 in the name of Saint-Gobain Glass France.
Notification of Reasons for Refusal for the Application No. 2016-025245 from Japan Patent Office dated Nov. 7, 2017,.

* cited by examiner

DEVICE FOR GENERATING A DISPLAY IMAGE ON A COMPOSITE GLASS PANE

CROSS REFERENCE TO RELATED APPLICATIONS

The present application is the US national stage of International Patent Application PCT/EP2012/064666 filed on Jul. 26, 2012 which, in turn, claims priority to European Patent Application EP 11179154.7 filed on Aug. 29, 2011.

The invention relates to a device for generating a display image on a composite glass pane as well as its use. The invention further relates to a method for generating a display image on a composite glass pane.

Head-up displays are widespread in aviation. The systems mounted in the direct field of vision of pilots display the most important data about their own and other aircraft. These systems, established and much used in the military sector, also have many possibilities for use in the civilian sector, in particular in the automobile sector. Thus, data about the speed, the distance from the preceding vehicle, or directional data from the navigation equipment can be displayed right at the eye level of the driver. These capabilities clearly improve the traffic safety of the vehicle as the driver cannot observe the traffic position and situation while looking at the instruments. With increased speeds of the motor vehicle, on freeways, for example, the distance traveled "blind" by the vehicle can be significant and can cause an increased accident risk.

U.S. Pat. No. 7,230,767 B2 discloses a head-up display for motor vehicles. The arrangement comprises a composite glass pane that contains luminescent compounds. The luminescent compounds are illuminated by a light source, for example, a laser, and appear in the field of vision of an automobile driver. For excitation of luminescent compounds, high laser powers of, for example, 100 mW, which can cause injury to a person's eyes or skin, are necessary. The laser radiation thus represents a hazard for vehicle occupants, in particular if a reflecting object, for example, a hand mirror, is situated between the laser projector and the vehicle window pane. The laser beam can be directed by the reflecting object, for example, into an eye of a vehicle occupant.

The international standard IEC 60825-1 Edition 2.0 defines a maximum permissible exposure (MPE). The MPE is the maximum power density of a laser, at which no injury to the eye occurs when the laser beam strikes a person's eye. Under consideration of the area exposed and the radiation power, the MPE yields a maximum permissible period of exposure. Laser radiation that strikes a person's eye for a period longer than the maximum permissible period of exposure produces eye injuries.

The laser radiation is moved for generating an image typically by one or a plurality of adjustable mirrors. The hazard for vehicle occupants from laser radiation is particularly great when, for example, mechanical damage results in a failure of mirror movement. The laser radiation is then directed at a fixed point. If the laser radiation enters the eye of a vehicle occupant, the maximum permissible exposure period can easily be exceeded.

From EP 2 233 962 A2, a display image generated on a windshield by means of laser radiation is known, wherein the laser radiation is directed at regular time intervals at a reflecting element. The reflecting element is arranged on the windshield and deflects the laser radiation to a sensor. If the sensor does not detect laser radiation, this indicates a malfunction and the laser radiation is discontinued. Such a solution does, in fact, result in a clear improvement of the safety of the vehicle occupants but has a number of disadvantages. The presence of an obstruction between the laser projector and the windshield is not checked continuously, but rather only during the periods in which the laser radiation is directed at the reflecting element. In addition, only those obstructions that are situated between the laser projector and the reflecting element can be detected. Obstacles in front of other regions of the windshield are not detected. Moreover, the installation and precise alignment of the reflecting element is complex and can negatively affect the appearance of the windshield.

From projection systems in which the display image is generated on a suitable surface, for example, a screen, by diffuse reflection and/or scatter of laser radiation, it is known that the hazard to persons can be reduced by detection of the diffuse reflection and/or scattered radiation. Such solutions are known, for example, from US 2006/0065735 A1, US 2001/0005262 A1, and US 2006/0244925 A1. In such projection systems, obstacles or other disruptions such as damage to the screen can be determined by a decrease in the radiation intensity detected. However, such a solution cannot be used In a head-up display on a glass pane because the smooth glass surface has an inadequate diffusely reflected radiation fraction. In addition, measures are frequently taken to further reduce the (intrinsically undesirable) reflection.

From JP 2009-145846 A, a head-up display is known wherein obstructions are detected by an additional light beam. The installation of another radiation source in addition to that which generates the display image is, however, technically very complex.

The object of the present invention is to provide an improved device for generating a display image on a composite glass pane, wherein the hazard to the vehicle occupants from laser radiation is avoided. The object of the present invention is further to provide a method for generating a display image on a composite glass pane.

The object of the present invention is accomplished according to the invention by a device for generating a display image on a composite glass pane in accordance with independent claim 1. Preferred embodiments emerge from the subclaims.

The device according to the invention for generating a display image on a composite glass pane comprises the following characteristics:
- a composite glass pane with a first pane and a second pane, which are connected to each other via an intermediate layer containing at least one luminescent pigment,
- a laser projector, which contains at least one laser and an optical system for deflecting the radiation of the laser, wherein the radiation is directed at the composite glass pane within a region of the composite glass pane,
- a photodetector, which detects luminescent radiation of the luminescent pigment, and
- a control unit, which electronically connects the photodetector and the laser projector.

The laser beam leaving the laser projector is directed at the composite glass pane. The laser beam penetrates into the intermediate layer via the first pane. At least part of the laser radiation is absorbed by the luminescent pigment during passage through the intermediate layer. The luminescent pigment is preferably optically excited and gives at least part of the excitation energy back off in the form of electromagnetic radiation. Luminescent radiation is emitted by the luminescent pigment. Luminescence includes fluorescence and/or phosphorescence processes. The luminescent radiation preferably has a different wavelength compared to the laser radiation, particularly preferably a greater wavelength. The luminescent radiation has, according to the invention, a wavelength in the range of visible light.

Preferably, the majority of the laser radiation is absorbed by the luminescent pigment during passage through the intermediate layer. Thus, a hazard to persons due to laser radiation transmitted through the pane can be advantageously avoided.

The emission of luminescent radiation by the luminescent pigment is statistically distributed in all spatial directions. Part of the luminescent radiation is directed at the eye of the viewer and is thus perceived by the viewer as a pixel on the pane.

The direction of the laser beam can be changed by means of the optical system of the laser projector. The laser beam can thus be moved at least over a region of the composite glass pane. By means of the movement of the laser beam over the composite glass pane, an image is generated, for example, a pictogram, numbers, and/or graphic characters. The region of the composite glass pane, within which an image is to be generated according to the invention and within which the laser beam can be moved over the composite glass pane, is referred to as the region of the composite glass pane accessible to the laser radiation. The region of the composite glass pane accessible to the laser radiation can include the entire region of the composite glass pane that is not shaded relative to the laser by objects between the laser projector and the composite glass pane, for example, mounting elements of the composite glass pane.

The photodetector is sensitive at least to electromagnetic radiation from at least part of the wavelength range of the luminescent radiation of the luminescent pigment. The photodetector is positioned and aligned such that luminescent radiation at least from the entire region of the composite glass pane accessible to the laser radiation can be detected. In particular, there must be no obstructions to electromagnetic radiation positioned between the photodetector and the region of the composite glass pane accessible to the laser radiation.

If laser radiation leaves the laser projector and, at the same time, no luminescent radiation is detected by the photodetector, there must be an obstruction arranged in front of the composite glass pane. The obstruction can be arranged between the laser projector and the pane and prevent the excitation of the luminescent pigment. Alternatively, the obstruction can be arranged between the photodetector and the composite glass pane and prevent the detection of the luminescent radiation. Such an obstruction is, for example, the head of a person or a reflecting object, for instance, a hand mirror, that could deflect the laser radiation into the eye of a person. To avoid a hazard for the viewer, the laser radiation must be interrupted in the presence of an obstruction in front of the composite glass pane. The control unit interrupts the emission of laser radiation from the laser projector when the photodetector detects no luminescent radiation.

The laser projector and the photodetector are electronically connected to each other via the control unit. The control unit can receive and process signals from the laser projector and from the photodetector. The control unit preferably includes an integrated circuit, for example, a microcontroller, a signal processor, or an FPGA (field programmable gate array). The control unit particularly preferably includes an application-specific standard product, (ASSP) or an application-specific integrated circuit (ASIC). This is particularly advantageous from the standpoint of the speed of the signal processing.

The laser projector transmits an ON signal, for example, a voltage signal of 1 V, to the control unit, when laser radiation leaves the laser projector. The laser projector transmits an OFF signal, for example, a voltage signal of 0 V, to the control unit, when no laser radiation leaves the laser projector. The photodetector transmits an ON signal to the control unit when luminescent radiation is detected and an OFF signal when no luminescent radiation is detected. The control unit compares the signals from the laser projector and the photodetector. If an ON signal of the laser projector is received and, at the same time, no ON signal of the photodetector, there must be an obstruction situated in front of the composite glass pane. In this case, the control unit interrupts the emission of laser radiation from the laser projector. A hazard to persons from the laser radiation is thus advantageously prevented by the device according to the invention for generating a display image on a composite glass pane.

The terms "ON signal" and "OFF signal" are intended to clarify the inventive ideas and must be broadly interpreted in the context of the invention. They must be understood to mean not merely two different, discrete signals. The transmission of the ON signal and the OFF signal can also include the transmission of raw data to the control unit, for example, the counting rates of the photodetector, which are interpreted only by the control unit using suitable limit values as an ON signal or an OFF signal. Generally speaking, ON signal and OFF signal are understood to mean any signal that enables the control unit to distinguish whether luminescent radiation is detected by the photodetector or whether laser radiation is leaving the laser projector.

The luminescent radiation of the luminescent pigment detected by the photodetector is clearly more intense than diffusely reflected and/or scattered fractions of the laser radiation. In addition, the intensity of the luminescent radiation is largely independent of position of the laser radiation on the composite glass pane. Consequently, obstructions can clearly be more efficiently recognized by the device according to the invention than, for example, by detection of diffusely reflected and/or scattered laser radiation. An undesired background radiation that is of weaker intensity than the luminescent radiation, caused, for example, by diffusely reflected and/or scattered laser radiation or other radiation sources, can, for example, be circumvented by introduction of a suitable threshold value of the photodetector.

The interruption of the emission of laser radiation from the laser projector can occur, for example, through interruption of the power supply to the laser. Alternatively, a beam blocker can be brought into the beam path. The beam blocker can be arranged between the laser and the optical system, within the optical system, or behind the optical system in the direction of the laser radiation. The interruption of the emission of laser radiation from the laser projector can also occur through electro-optic or acousto-optic components.

In an advantageous embodiment of the invention, the photodetector includes a camera with a two-dimensional image sensor, for example, a CCD sensor. Preferably, the photodetector includes a camera with an active pixel sensor (APS sensor, CMOS sensor). The particular advantage resides in the high readout speed of the APS sensor and the low power requirement.

The position of the laser radiation on the composite glass pane is defined by the optical system of the laser projector. The position of the laser radiation on the composite glass pane determines the position of the detected luminescent radiation on the two-dimensional image sensor of the camera. In a particularly preferred embodiment of the invention, the information about the intended position of the laser radiation on the pane is transmitted to the camera by the control unit. Thus, the entire APS sensor need not be read out, but only a subregion of the sensor that includes the position of the luminescent radiation on the APS sensor. This is particularly advantageous from the standpoint of the readout speed.

The sequence of pixels or pixel groups beamed in succession at the two-dimensional image sensor of the camera, can be compared by the control unit with the shape of the image to be generated. This enables the functionality of the device for generating a display image on a composite glass pane to be advantageously checked.

In an alternative advantageous embodiment of the invention, the photodetector includes at least one single pixel photosensor, for example, a light dependent resistor, a phototransistor, or a secondary electron multiplier, preferably a photodiode. The photodiode is a semiconductor diode that converts visible light on a p-n-junction or a pin-junction through the internal photo effect into electrical current. Semiconductor materials suitable for detection in the visible spectral range include, for example, silicon or III-V-compound semiconductors such as arsenides, phosphides, or nitrides of gallium, aluminum, and/or indium. The particular advantage of a photodiode resides in its short reaction time.

In a preferred embodiment of the invention, the laser beam leaving the laser projector is periodically interrupted, for example, by a chopper. The radiation detected by the photodetector in the phases with interrupted laser radiation can be subtracted from the radiation detected in the phases in which the luminescent pigments in the pane are excited. The disruptive effect of external light sources, for example, daylight or warning lights of fire service or police ("blue light"), is thus advantageously reduced. The signal-to-noise ratio can be improved by means of a lock-in amplifier.

In another preferred embodiment of the invention, the signal-to-noise ratio of the photodetector is improved with an optimal filter method (matched filter). In this case, the laser radiation is emitted from the laser projector with a characteristic, periodically repeating pulse sequence. The pulse sequence can be generated, for example, by a chopper or by interruptions of the power supply of the laser. The luminescent radiation leaving the composite glass pane then occurs with the same characteristic pulse sequence. The signal of the photodetector is analyzed for the presence of the characteristic pulse sequence. Thus, the luminescent radiation can be advantageously distinguished from the background radiation.

The wavelength range detectable by the photodetector is preferably adapted to the wavelength range of the luminescent radiation of the luminescent pigment. This can be accomplished, for example, by suitable spectral filters in front of the active surface of the photodetector. The disruptive influence of other light sources is thus advantageously reduced. One such other light source can, for example, even be the laser if a fraction of the laser radiation is reflected or scattered.

The photodetector can also include lenses and/or other optic, electronic, or mechanical components.

The laser projector includes at least one laser as a radiation source and an optical system that defines the direction of the laser radiation and, thus, the illuminated site on the composite glass pane.

The optical system of the laser projector includes at least one mirror, which is connected to a movable component. The movable component can include, for example, at least one piezoelement. Preferably, the movable component includes a component based on the microsystem principle (microelectromechanical system, MEMS). The mirror and movable MEMS component form a so-called "Mikrospiegelaktor" (micromirror device), more precisely, a so-called "microscanner". The particular advantage resides in a smaller size, less weight, less power consumption, and robustness against environmental influences.

By means of the movable component, the mirror can be tilted in two directions, preferably two directions orthogonal to each other, particularly preferably horizontally and vertically. The optical system can even contain a plurality of mirrors each connected to a movable component. For example, the optical system can include two mirrors, with one mirror capable of being tilted horizontally and the other mirror capable of being tilted vertically. The optical system can also include other mechanical, electronic, and/or optical components, for example, lenses.

The alignment of the mirror defines the target position of the laser radiation on the composite glass pane. The target position of the laser radiation on the composite glass pane is illuminated by the laser radiation if laser radiation leaves the laser projector.

The target position of the laser radiation on the composite glass pane is moved, for generating an image, within the region of the composite glass plane accessible to the laser radiation. When the target position of the laser radiation on the composite glass pane is arranged within the area of the image to be generated, laser radiation leaves the laser projector and strikes the composite glass pane. When the target position of the laser radiation on the composite glass pane is not arranged within the area of the image to be generated, no laser radiation leaves the laser projector.

In a preferred embodiment of the invention, the image on the composite glass pane is generated by a raster scan method. The target position of the laser radiation on the composite glass pane is periodically moved line-by-line over at least part of the region of the composite glass pane accessible to the laser radiation. The distance between two adjacent lines can be the same as the width of the laser beam on the composite glass pane. Alternatively, the distance between two adjacent lines can be smaller or larger than the width of the laser beam on the composite glass pane. The particular advantage of the raster scan method resides in a homogeneous distribution of the laser radiation in the region of the image to be generated. Thus, homogeneous brightness of the image is achieved.

In another preferred embodiment of the invention, the image on the composite glass pane is generated by a vector scan method. The shape of the image to be generated is reproduced by the movement of the target position of the laser radiation on the composite glass pane. The target position is localized on the composite glass pane during the entire time of the movement of the laser radiation within the area of the image to be generated when the image has a single contiguous area (such as, for example, the number "0"). Thus, laser radiation leaves the laser projector during the entire time of the movement of the laser radiation. This advantageously yields a high excitation rate of the luminescent pigment and high brightness of the image. During the generation of an image that has a plurality of areas separated from each other (such as, for example, the number "10"), the intended position of the laser beam on the composite glass is localized within the area of the image to be generated during the majority of the time of the laser movement.

The image can also be generated by combinations of vector scan methods and raster scan methods.

The laser is preferably a diode laser. The laser preferably emits electromagnetic radiation with a wavelength from 360 nm through 420 nm. A suitable commercially available diode laser is, for example, a diode laser with an emission wavelength of, for instance, 405 nm.

In a particularly advantageous embodiment of the invention, the laser emits electromagnetic radiation with a wavelength from 375 nm through 400 nm, for example, 395 nm. This is advantageous from the standpoint of the excitation of luminescent pigments with emission wavelengths in the visible spectral range. The wavelength of the laser radiation is, in this case, in the UV-A range of the electromagnetic spectrum. The particular advantage resides in a higher maximum permissible exposure in the UV-A range (315 nm through 400 nm) than in the visible range (400 nm through 780 nm). The higher maximum permissible exposure results from different mechanism of action of the radiation in the eye. UV-A radiation acts on the crystalline lens of the eye; visible radiation acts on the retina of the eye. The higher maximum permissible exposure yields, with identical exposure intensity, a longer maximum permissible duration of exposure in the UV-A range than in the visible range. For example, the maximum permissible duration of exposure with an exposure intensity of $1\times10^6$ W/m$^2$ in the visible range is less than $1\times10^{-8}$ s; and in the UV-A range, more than $1\times10^{-3}$ s. Thus, the required reaction time, within which the laser radiation must be interrupted after detection of an obstruction between the laser projector and the composite glass pane, is advantageously lengthened.

The laser projector projector can also include a plurality of lasers. The various lasers can have the same emission wavelength or different emission wavelengths.

The power of the laser radiation when emitted from the laser projector is preferably from 5 mW through 1000 mW, particularly preferably from 50 mW through 600 mW. This is particularly advantageous from the standpoint of the generation of an adequately bright image.

The electromagnetic radiation emitted by the laser is typically linearly polarized. With linear polarization, the direction of the oscillation of the electric field is constant. The absolute value and sign of the electric field change periodically. The preferred oscillation direction is referred to as the polarization direction. Linearly polarized light can be decomposed into two components of equal frequency and equal propagation direction that oscillate perpendicular to each other with equal amplitude and in phase. The intensity ratio of the two components is referred to as the polarization ratio. The polarization ratio is, according to the invention, preferably at least 50:1, particularly preferably at least 90:1.

In an advantageous embodiment of the invention, the laser radiation is parallel (p-) polarized or dominantly p-polarized relative to the surface of the composite glass pane. P-polarized means that the polarization direction at the time the laser radiation strikes the composite glass pane is in the plane of incidence. The plane of incidence is spanned by the incidence vector and the surface normal of the composite glass pane at the site at which the laser radiation strikes the composite glass pane. P-polarized laser radiation is highly refracted instead of reflected at the surface of the composite glass pane. This is particularly advantageous with regard to the reduction of reflections of the laser radiation on the composite glass pane, which could distract or even endanger the viewer. In addition, a greater share of the laser radiation strikes the intermediate layer of the composite glass pane with the luminescent pigment. This advantageously increases the excitation rate of the luminescent pigment. The polarization direction can be adjusted by rotation of the laser around the axis defined by the emission direction. Alternatively, the polarization direction can be adjusted, for example, by a λ/2 wave plate.

To achieve a high polarization ratio, the laser projector can also include one or a plurality of polarizers, for example, polarization filters.

The degree of reflection of the linearly polarized laser radiation depends on the angle of incidence of the laser radiation on the surface of the composite glass pane. The degree of reflection is the ratio of reflected radiant power to incident radiant power. The angle of incidence is the angle between the incidence vector and the surface normal of the composite glass pane at the site at which the laser radiation strikes the surface of the composite glass pane. The reduction of reflections of the linearly polarized laser radiation is particularly pronounced when the angle of incidence equals the so-called Brewster's angle. With incidence of light at Brewster's angle, the degree of reflection for p-polarized radiation is zero. The Brewster's angle on an air/gas transition preferably occurring according to the invention is roughly 57.2°.

In a particularly advantageous embodiment of the invention, the angle of incidence at which the laser radiation strikes the surface of the composite glass pane, in the entire region of the composite glass pane accessible to the laser radiation is between 20° and 70°. The degree of reflection is typically less than or equal to 0.04. Very particularly preferably, the angle of incidence is between 38° and 66°. The degree of reflection is typically less than or equal to 0.02. This is particularly advantageous with regard avoiding disturbing reflections on the surface of the composite glass pane.

In another advantageous embodiment of the invention, an antireflective coating is arranged on the surface of the first pane of the composite glass pane facing the laser projector. Thus, reflections of laser radiation on the composite glass pane are advantageously reduced and the excitation rate of the luminescent pigment is advantageously increased. The antireflective coating preferably includes a porous layer that contains silicon dioxide. The particular advantage resides in an independence of the reflection-reducing properties from the angle of incidence of the laser radiation on the composite glass pane. The porous layer can, for example, be produced by an etching method, and is, for example, disclosed in DE822714B. Alternatively, the porous layer can be applied in a sol-gel process from a colloidally dispersed solution. Suitable methods are disclosed, for example, in DE19918811A1 and GB2424382A. The reflection-reducing properties are particularly preferably optimized on the emission wavelength of the laser used, which can be accomplished through the selection of the layer thickness of the antireflective coating. The reflection-reducing properties are optimum when the layer thickness of the antireflective coating is one quarter of the emission wavelength of the laser or an odd multiple of one quarter of the emission wavelength of the laser.

In an advantageous embodiment of the invention, the device for generating a display image on a composite glass pane further includes at least one photodetector sensitive in the mid-infrared wavelength range, preferably a phototransistor or a photodiode. The infrared photodetector is preferably sensitive in a wavelength range from 4 µm through 10 µm. In this wavelength range, the composite glass pane preferably has very little or no transmission. Suitable semiconductor materials for the photodiode are, for example, CdTe or GeAu compounds. The infrared photodetector is positioned and aligned such that the infrared radiation leaving the composite glass pane from preferably at least the region of the composite glass pane accessible to the laser radiation is detected. Particularly preferably, infrared radiation from only the region of the composite glass pane accessible to the laser radiation is detected. For this, the directionality of the infrared photodetector can be influenced by structural elements, for example, shutters.

The infrared photodetector preferably detects the thermal radiation leaving the composite glass pane. The infrared photodetector is preferably arranged, within the context of structural feasibility, at the least possible distance from the site of the emission of the laser radiation from the laser projector.

The infrared photodetector is preferably connected to the control unit. An obstruction that is moved in front of the composite glass pane results in a sudden change in the infrared radiation detected by the infrared photodetector. In the event of a sudden change in the infrared radiation detected, the emission of laser radiation from the laser projector is interrupted by the control unit. The particular advantage resides in a further reduction of the hazard to a human viewer from the laser radiation. In particular, an obstruction in front of the composite glass pane can already be detected before the laser radiation is turned on.

In an alternative preferred embodiment of the invention, the infrared photodetector detects the radiation reflected on the pane from an infrared radiation source, for example, a light emitting diode or a incandescent bulb combined with a suitable spectral filter. In this case, preferably, diffusely reflected radiation fractions are detected by the infrared photodetector. The infrared radiation source preferably emits infrared radiation within the wavelength range from 4 µm through 10 µm. The infrared radiation can include the entire wavelength range from 4 µm through 10 µm. Alternatively, the infrared radiation can include a sub-range of the wavelength range from 4 µm through 10 µm, for example, an emission line around 5 µm with a halfwidth of 0.05 µm. The entire wavelength range emitted by the infrared radiation source can even exceed the wavelength range from 4 µm through 10 µm. Preferably, at least the entire region of the composite glass pane accessible to the laser radiation is illuminated by the infrared radiation source. The infrared radiation source is preferably arranged, within the context of structural feasibility, at the least possible distance from the site of the emission of the laser radiation from the laser projector. The infrared radiation source can even be arranged within the laser projector. A sudden change in the radiation detected by the infrared photodetector indicates, even in this embodiment, an obstruction of the composite glass pane. In this case, the emission of laser radiation from the laser projector is advantageously interrupted by the control unit.

The capability of detecting an obstruction in front of the composite glass pane by means of the infrared photodetector and, optionally, the infrared radiation source is independent of the photodetector sensitive to the luminescent radiation of the luminescent pigment. It is accordingly conceivable, in principle, to provide a reduced hazard to a viewer from laser radiation through the infrared photodetector alone and, optionally, the infrared radiation source.

In an alternative advantageous embodiment of the invention, the device for generating a display image on a composite glass pane further includes at least one ultrasound source and one ultrasound detector. The ultrasound source and the ultrasound detector are preferably connected to the control unit. The ultrasound detector emits an ultrasound signal at regular time intervals. The repetition interval of the ultrasound signal is preferably from 0.5 ms through 10 ms. The ultrasound signal strikes the ultrasound detector after reflection on the composite glass pane. The time interval between emission and detection of the ultrasound signal is determined by the distance traveled by the ultrasound signal from the ultrasound source to the composite glass pane and from the composite glass pane to the ultrasound detector. The control unit monitors the time interval between emission and detection of the ultrasound signal. When an obstruction is situated in front of the composite glass pane, the ultrasound signal is reflected on the obstruction and after a shorter time period to the ultrasound detector. In this case, the emission of laser radiation from the laser projector is interrupted by the control unit. The particular advantage resides in a further reduction of the hazard for a human viewer from the laser radiation. In particular, an obstruction in front of the composite glass pane can already be detected before the laser radiation is turned on.

The capability of detecting an obstruction in front of the composite glass pane by means of the ultrasound detector and the ultrasound source is independent of the photodetector sensitive to the luminescent radiation of the luminescent pigment. It is accordingly conceivable, in principle, to provide a reduced hazard to a viewer from laser radiation through the ultrasound detector and the ultrasound source alone.

The composite glass pane according to the invention includes at least one first pane and one second pane, which are connected to each other via an intermediate layer.

The panes preferably contain flat glass (float glass), quartz glass, borosilicate glass, or soda-lime glass. The panes preferably have a mean light transmission (unless otherwise specified, as light transmission for light type A and a 2°-standard observer according to DIN 5033 for light of the wavelengths from 380 nm to 780 nm) of more than 80%, preferably more than 90%. The panes preferably have a light transmission of >70%, particularly preferably 75% in the wavelength range from 360 nm through 420 nm.

The first pane and/or the second pane preferably have a thickness of 1 mm to 4 mm, particularly preferably 1.4 mm to 2.5 mm. The first pane and the second pane can have different thicknesses.

The first pane and/or second pane preferably have tinting and/or coating. The tinting and/or coating can amplify the contrast of the projected image and protect the luminescent pigments from aging. The second pane, facing away from the laser projector, preferably contains tinting and/or coating and the first pane, facing the laser projector, contains no tinting and/or coating.

The intermediate layer preferably includes at least one thermoplastic polymer, particularly preferably at least polyvinyl butyral (PVB). The intermediate layer can also contain polyethylene terephthalate (PET), polyvinyl chloride (PVC), polyurethane (PU), and/or polyethyl vinyl acetate (EVA). The intermediate layer can also include mixtures or copolymers of different polymers.

The intermediate layer preferably has a thickness of 0.30 mm to 0.9 mm, preferably 0.50 mm to 0.800 mm. in this range for the layer thickness, good results are obtained.

The intermediate layer preferably has light transmission of >70%, preferably >80% in the wavelength range from 390 nm through 410 nm. The light transmission of the intermediate layer can be set by film thickness, polymer composition, degree of polymerization, distribution of polymerization, UV blockers, or plasticizers. The intermediate layer according the invention enables only slight weakening of the exciting and emitted electromagnetic radiation and, thus, high luminosity of the head-up display.

The intermediate layer can also include a plurality of individual layers.

The intermediate layer can include one or a plurality of barrier layers against diffusion of the luminescent pigment. Barrier layers preferably contain polybutylene terephthalate (PBT), polycarbonate (PC), polyethylene terephthalate (PET) and polyethylene naphthalate (PEN), polyvinyl chloride (PVC), polyvinyl fluoride (PVF), polyvinyl butyral (PVB) without plasticizers and/or copolymers thereof, particularly preferably polyethylene terephthalate (PET).

The intermediate layer can include other functional layers, for example, heatable layers, coatings with antenna function, and/or low emissivity coatings.

The intermediate layer according to the invention contains at least one luminescent pigment. Luminescent pigments contain, in the context of the invention, organic and/or inorganic chromophoric or luminescent compounds, ions, aggregates, and/or molecules.

When the intermediate layer includes multiple individual layers, the luminescent pigment can be contained in one or in a plurality of the individual layers. Even different luminescent pigments can be contained in different individual layers of the intermediate layer.

The luminescent pigment preferably has a local excitation maximum in the range from 350 nm to 450 nm, particularly preferably 390 nm to 420 nm. Good results are obtained in this range.

The luminescent pigment preferably has a local emission maximum in the range from 400 nm to 800 nm, particularly preferably 430 nm to 500 nm. Good results are obtained in this range. The luminescent pigment preferably includes a hydroxyalkyl terephthalate with the formula: $R_1$—COO-Ph(OH)$_x$—COO—$R_2$, where $R_1$, $R_2$ is an alkyl or allyl radical having 1 to 10 C atoms, Ph is a phenyl ring, OH is a hydroxyl group bonded to the phenyl ring, and x is a whole number from 0 through 4. The general structural formula is:

The luminescent pigment preferably includes diethyl 2,5-dihydroxyterephtalate. The structural formula is:

The luminescent pigment can also contain benzopyranes, naphthopyranes, 2H-naphthopyranes, 3H-naphthopyranes, 2H-phenanthropyranes, 3H-phenanthropyranes, photochromic resins, coumarins, xanthines, naphthalic acid derivatives, oxazoles, stilbenes, styryls, perylenes, naphthalimides, naphthals, phenyls, xanthenes, lanthanides, preferably Y2O3:Eu, YVO4:Tm, Y2O2S:Pr, Gd2O2S:Tb, and/or mixtures thereof.

For producing the composite glass pane, the luminescent pigment is applied, preferably with a solvent, to the intermediate layer or to an individual layer of the intermediate layer, for example, by spraying, screen printing, offset printing, ink jet printing, and/or flexographic printing. The solvent preferably contains alcohols, ketones, esters, amines, amides, and/or mixtures thereof. The solvent particularly preferably contains ethanol, tetrahydrofuran, and/or benzyl alcohol. Most of the solvent is lost through evaporation after the application of the luminescent pigment. During the lamination of the intermediate layer between the first and the second pane, the luminescent pigment is preferably distributed uniformly in the entire intermediate layer or in one or a plurality of individual layers of the intermediate layer. The lamination takes place preferably at temperatures of 120° C. to 170° C., a pressure of 10 bar to 15 bar, and for a period of 30 min to 240 min.

The intermediate layer preferably contains 0.1 g/m² to 15 g/m² of luminescent pigment. The quantity indications are based on a thickness of the intermediate layer of roughly 0.76 mm. Good results are obtained in this range.

The object of the invention is further accomplished by a method for generating a display image on a composite glass pane, wherein the radiation of a laser is directed via an optical system of a laser projector at a composite glass pane containing at least one luminescent pigment and an ON signal is transmitted by the laser projector to a control unit when laser radiation leaves the laser projector, an ON signal is transmitted by a photodetector to the control unit when luminescent radiation of the luminescent pigment from the region of the composite glass pane accessible to the radiation of the laser is detected, and the control unit interrupts the emission of laser radiation from the laser projector when the ON signal of the laser projector is received and, at the same time, no ON signal of the photodetector is received by the control unit.

The hazard to the viewer from the laser radiation is particularly great at the time of a disruption of the mirror movement and, thus, a stationary laser beam. In an advantageous embodiment of the invention, the movability of the adjustable mirror of the optical system of the laser projector is checked at regular time intervals. For this, a regular signal is evoked by the laser projector which requires the movability of the mirror to generate the signal. For example, a predefined position on the composite glass pane, preferably in the edge region of the region of the composite glass pane accessible to the laser radiation, is regularly illuminated by the laser projector. The frequency with which the predefined position on the composite glass pane is illuminated is preferably from 30 Hz to 50 Hz. This is particularly advantageous from the standpoint of the ability to react quickly in the event of a lack of movability of the mirror as well as to avoid damage to the movable component connected to the mirror. The arrival of a regular signal at the appropriate position on the two-dimensional image sensor is analyzed by a camera as a photodetector. In the absence of the regular signal, the emission of laser radiation from the laser projector is advantageously interrupted.

In an alternative advantageous embodiment of the invention, the laser beam is regularly aimed at a predefined position within the laser projector. An additional photodetector connected to the control unit, for example, a photodiode, a light dependent resistor, or a phototransistor is arranged at the predefined position within the laser projector. The particular advantage resides in that the movability of the adjustable mirror can be monitored by a regular signal without laser radiation leaving the laser projector at the time of generation of the regular signal and, for example, generating a distracting illuminated point on the composite glass pane. Absence of the regular signal on the photodetector within the laser projector indicates damage to the adjustable mirror. In this case, the emission of laser radiation from the laser projector is advantageously interrupted.

The device for generating a display image on a composite glass pane is preferably used as a transparent display, particularly preferably as a head-up display in buildings, motor vehicles, airplanes, helicopters, and/or watercraft.

The invention is explained in detail with reference to drawings and exemplary embodiments. The drawings are a schematic representation and not true to scale. The drawings in no way restrict the invention. They depict.

Figure 1:
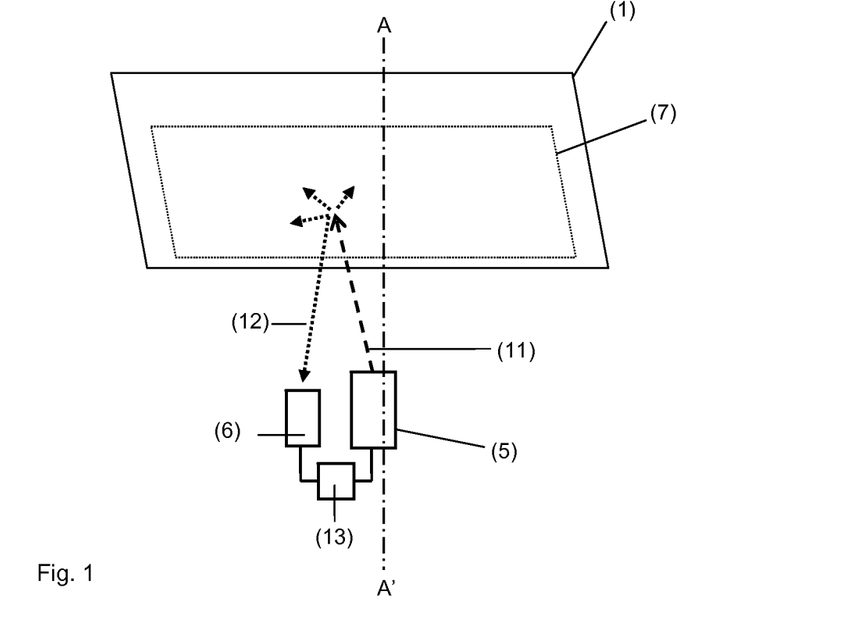
FIG. 1 a schematic representation of a device according to the invention for generating a display image on a composite glass pane, FIG. 2 a cross-section along A-A' through the device according to FIG. 1, FIG. 3 cross-section along A-A' through another embodiment of the device according to the invention, FIG. 4 a diagram of the maximum permissible exposure in various wavelength ranges, FIG. 5 a diagram of the degree of reflection as a function of the angle of incidence, FIG. 6 a schematic representation of the reflection of laser radiation on a composite glass pane, and FIG. 7 a detailed flow chart of the method according to the invention.
Figure 2:
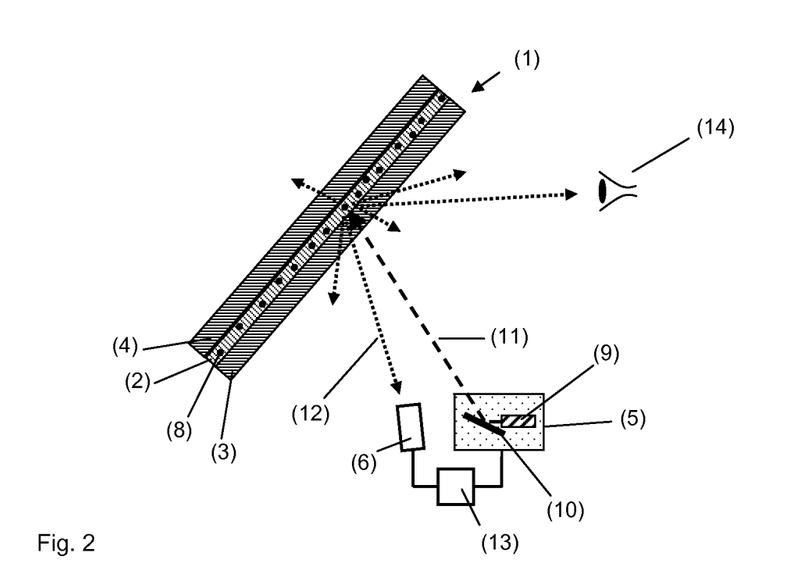

FIG. 1 and FIG. 2 each depict a detail of a device according to the invention for generating a display image on a composite glass pane. The composite glass pane 1 has a width of 150 cm and a height of 90 cm. The composite glass pane 1 includes a first pane 3 and a second pane 4 with thicknesses of 2.1 mm. The composite glass pane 1 further includes an Intermediate layer 2 with a thickness of 0.76 mm. The intermediate layer 2 includes PVB. The intermediate layer 2 further includes diethyl 2,5-dihydroxyterephtalate as luminescent pigment 8. The diethyl 2,5-dihydroxyterephtalate was applied at the time of production of the composite glass pane 1 at a concentration of roughly 3 g/m$^2$ to the surface of the intermediate layer 2.

The laser projector 5 includes a laser 9 and an optical system 10 for deflecting the laser radiation 11. The laser 9 is a diode laser with an emission wavelength of 395 nm. The output power of the laser 9 is 200 mW. The light transmission through the composite glass pane 1 is, at the emission wavelength of the laser 9 used, less than 0.1% due to absorption by the luminescent pigment 8. Thus, a hazard to persons from laser radiation that is transmitted by the composite glass pane 1 is advantageously prevented.

The optical system 10 includes an MEMS microscanner. The laser radiation 11 can be moved over the composite glass pane 1 by the MEMS microscanner. The movement of the laser radiation 11 is possible within the region 7 of the composite glass pane 1. The luminescent pigment 8 is optically excited by the laser radiation 11. The luminescent pigment 8 subsequently gives off luminescent radiation 12 in the wavelength range of visible light. Part of the luminescent radiation 12 reaches the eye of the viewer 14 and is perceived as a pixel on the composite glass pane 1. An image, for example, a pictogram, a number, or a graphic character, is generated by the movement of the laser radiation 11 over the composite glass pane 1.

The photodetector 6 includes a camera with an active pixel sensor. Through the use of suitable spectral filters, the camera can detect light in a wavelength range from 430 nm through 480 nm. The camera can detect luminescent radiation 12 of the luminescent pigment 8 from the entire region 7 of the composite glass pane 1 accessible to the laser radiation 11.

The photodetector 6 and the laser projector 5 are connected to the control unit 13. The control unit 13 includes an application-specific integrated circuit (ASIC). The laser projector 5 transmits an ON signal to the control unit 13 when laser radiation 11 leaves the laser projector 5. The photodetector 6 transmits an ON signal to the control unit 13 when luminescent radiation 12 is detected. When laser radiation 11 leaves the laser projector 5, but, at the same time, no luminescent radiation 12 is detected, there must be an obstruction situated between the laser projector 5 and the composite glass pane 1 or between the photodetector 6 and the composite glass pane 1. In this case, the control unit 13 interrupts the power supply of the laser 9. A hazard to the viewer 14 from, for example, laser radiation 11 reflected on the instruction is no longer possible.

Figure 3:
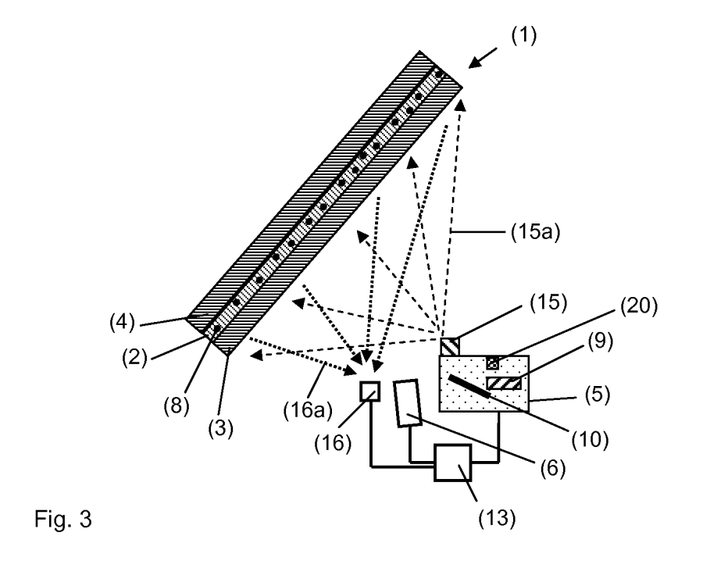

FIG. 3 depicts a cross-section A-A' of another embodiment of the device according to the invention for generating a display image on a composite glass pane. An infrared radiation source 15 illuminates the entire region 7 of the composite glass pane 1 accessible to the laser radiation 11. The infrared radiation source 15 is arranged near the radiation emission of the laser projector 5. The infrared radiation source 15 includes an incandescent bulb with suitable spectral filters and emits infrared radiation 15a with a wavelength of roughly 5 μm. The infrared radiation 15a is reflected on the surface of the composite glass pane 1. An infrared photodetector 16 detects preferably the diffusely reflected fraction of the infrared radiation 16a from the region 7 of the composite glass pane 1 accessible to the laser radiation 11. The infrared photodetector 16 is connected to the control unit 13. Upon occurrence of a sudden change in intensity of the infrared radiation 16a detected, for example, as a result of the sudden introduction of an obstruction in front of the composite glass pane 1, the control unit 13 interrupts the emission of laser radiation 11 from the laser projector 5. For this, the control unit 13 interrupts, for example, the power supply of the laser 9.

In an alternative embodiment of the invention, the infrared photodetector 16 detects the thermal radiation leaving the composite glass pane 1. A sudden change in the detected thermal radiation indicates an obstruction in front of the composite glass pane 1. In this case, the control unit 13 advantageously interrupts the emission of laser radiation 11 from the laser projector projector 5. An infrared radiation source 15 is unnecessary.

A photodiode is arranged as a photodetector 20 within the laser projector 5. The laser radiation 11 is regularly directed at the photodetector 20 with a frequency of 30 Hz. The photodetector 20 is connected to the control unit 13. Absence of the regular radiation signal on the photodetector 20 indicates damage to the optical system 10, in particular to the adjustable mirror. In this case, the control unit 13 advantageously interrupts the emission of laser radiation 11 from the laser projector 5.

Figure 4:
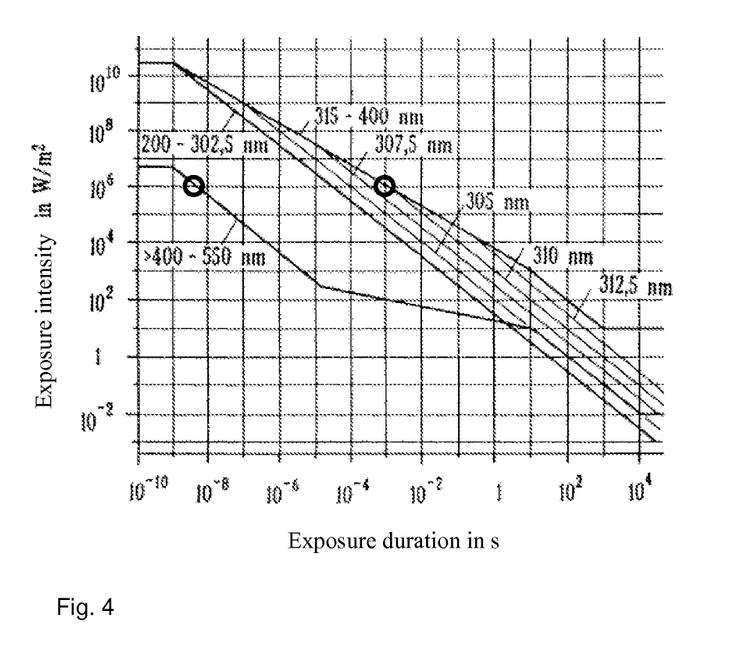

FIG. 4 shows a diagram of the maximum permissible exposure as a function of the duration of exposure for various wavelength ranges. With an exposure intensity of, for example, $1 \times 10^6$ W/m², the maximum permissible exposure in the visible wavelength range from >400 nm through 700 nm is exceeded after roughly $5 \times 10^{-6}$ s. In the UV-A wavelength range from 315 nm through 400 nm, the maximum permissible exposure at the same exposure intensity is not exceeded until roughly $1 \times 10^{-3}$ s. The points described are identified in the figure by circles. The plotting illustrates the advantage of a laser 9 with an emission wavelength in the UV-A range compared to the laser 9 with an emission wavelength in the visible range. The diagram is from http://www2.physik.uni-Greifswald.de/sensoren/skripten/LASER11.pdf.

Figure 5:
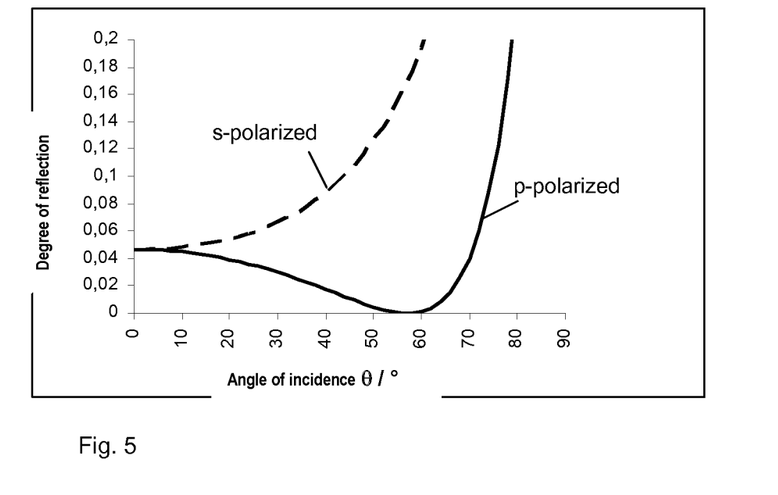

FIG. 5 shows a diagram of the degree of reflection for p- and s-polarized laser radiation 11 at an air/gas transition as a function of the angle of incidence θ. With p-polarized laser radiation 11, the electric field vector lies in the plane of incidence; with s-polarized laser radiation 11, the electric field vector is perpendicular to the plane of incidence. S-polarized light is more strongly reflected than p-polarized light. For an angle of incidence θ in the range from 20° to 70°, the degree of reflection for p-polarized light is less than or equal to 0.04. For an angle of incidence θ in the range from 38° to 67°, the degree of reflection for p-polarized light is less than or equal to 0.02. The values for the degree of reflection were calculated with a typical index of refraction for glass of 1.55 at a standard wavelength of 589 nm. The values for the degree of reflection can deviate slightly from the values indicated here as a function of the material used for the pane and the laser wavelength used.

Figure 6:
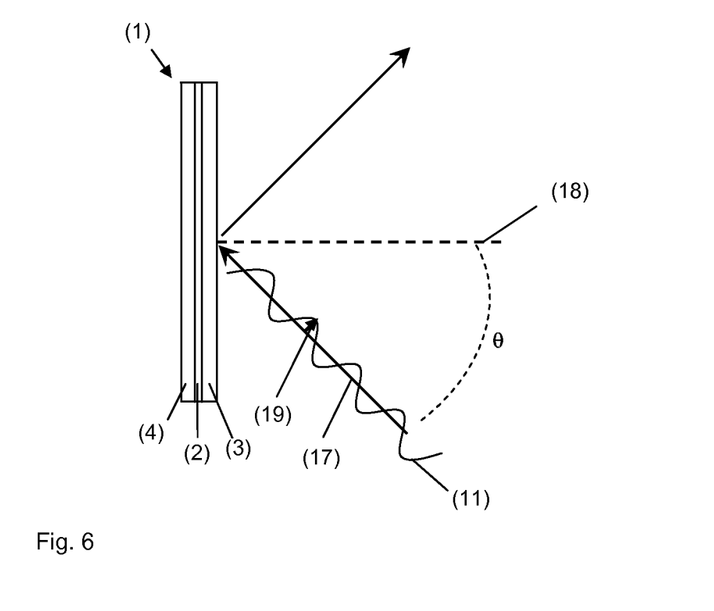

FIG. 6 illustrates the geometric parameters with reflection of laser radiation 11 on the composite glass pane 1. The direction of propagation of the laser radiation 11 striking the composite glass pane 1 is described by the incidence vector 17. The incidence vector 17 and the surface normal 18 of the composite glass pane 1 at the site, at which the laser radiation 11 strikes the surface of the composite glass pane 1, enclose the angle of incidence θ. The incidence vector 17 and the surface normal 18 span the plane of incidence. The laser radiation 11 is depicted as a periodic curved line, which illustrates the deflection of the electric field in the direction of the electric field vector 19. With p-polarized laser radiation 11, the electric field vector 19 lies in the plane of incidence.

Figure 7:
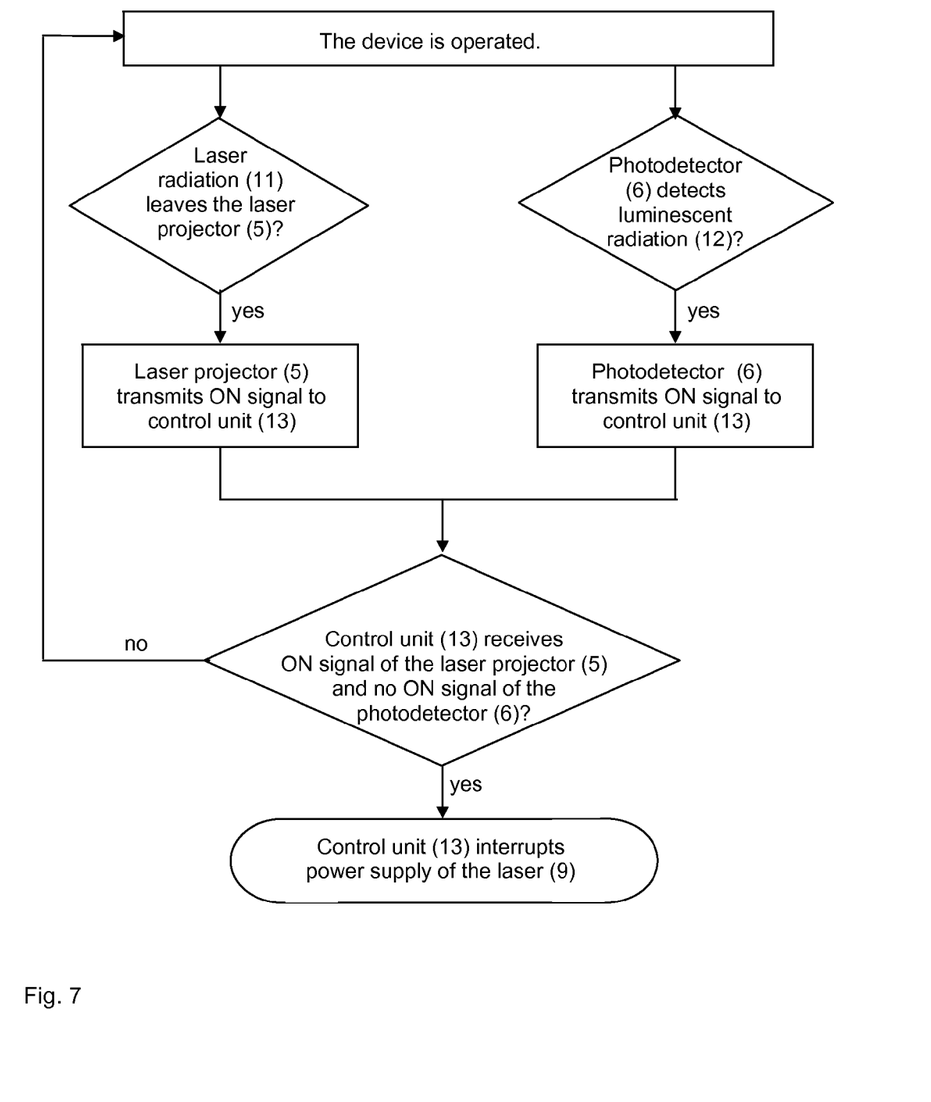

FIG. 7 depicts, by way of example, the method according to the invention for generating a display image on a composite glass pane.

A device for generating a display image on a composite glass pane according to FIG. 1 was tested. It was demonstrated that injury to the eye of a viewer 14 from laser radiation 11 reflected by an obstruction can be prevented. This result was unexpected and surprising for the person skilled in the art.

LIST OF REFERENCE CHARACTERS (1) composite glass pane
(2) intermediate layer of the composite glass pane 1
(3) first pane of the composite glass pane 1
(4) second pane of the composite glass pane 1
(5) laser projector
(6) photodetector
(7) region of the composite glass pane 1
(8) luminescent pigment
(9) laser
(10) optical system for deflecting the laser radiation 11
(11) laser radiation
(12) luminescent radiation
(13) control unit
(14) viewer
(15) infrared radiation source
(15a) infrared radiation
(16) infrared photodetector
(16a) part of the reflected infrared radiation
(17) incidence vector of laser radiation 11 on a reflecting surface
(18) surface normal of a reflecting surface
(19) electric field vector of linearly polarized radiation
(20) photodetector within the laser projector 5
θ angle of incidence of laser radiation 11 on a reflecting surface
A-A' section line

The invention claimed is:

1. A device for generating a display image on a composite glass pane, comprising:
    a composite glass pane with a first pane and a second pane, which are connected to each other via an intermediate layer containing at least one luminescent pigment;
    a laser projector, which contains at least one laser and an optical system for deflecting a laser radiation of the at least one laser, wherein the laser radiation is directed within a region of the composite glass pane;
    a photodetector, which detects luminescent radiation of the at least one luminescent pigment, wherein the luminescent radiation has a different wavelength than the laser radiation, wherein the photodetector is positioned and aligned such that luminescent radiation from at least an entire region of the composite glass pane accessible to the laser radiation can be detected, wherein a wavelength range detectable by the photodetector is adapted to a wavelength range of the luminescent radiation of the at least one luminescent pigment by a spectral filter in front of an active surface of the photodetector; and
    a control unit, which electronically connects the photodetector and the laser projector,
    wherein the control unit interrupts an emission of radiation from the laser projector when no luminescent radiation is detected by the photodetector.

2. The device according to claim 1, wherein the photodetector includes at least one camera with a two-dimensional image sensor.

3. The device according to claim 1, wherein the photodetector includes at least one single pixel photo sensor.

4. The device according to claim 1, wherein the control unit compares signals transmitted by the laser projector and by the photodetector.

5. The device according to claim 1, wherein the laser projector includes a diode laser and the diode laser emits radiation with a wavelength from 360 nm to 420 nm.

6. The device according to claim 1, wherein the optical system for deflecting the radiation includes at least one MEMS microscanner.

7. The device according to claim 1, wherein the radiation is linearly polarized with a polarization ratio of at least 50:1, a p-polarized radiation striking the composite glass pane in a p-polarized manner.

8. The device according to claim 7, wherein an angle of incidence θ of the radiation when the radiation strikes the composite glass pane is from 20° to 70°.

9. The device according to claim 1, wherein the laser projector emits radiation with a periodically repeating pulse sequence.

10. The device according to claim 1, further comprising an infrared photodetector that is connected to the control unit and that detects infrared radiation reflected by the composite glass pane, wherein the infrared photodetector is sensitive in a wavelength range from 4 μm to 10 μm.

11. The device according to claim 10, further comprising an infrared radiation source that emits infrared radiation within the wavelength range from 4 μm to 10 μm to the composite glass pane.

12. The device according to claim 1, further comprising an ultrasound source and an ultrasound detector that are connected to the control unit, wherein the ultrasound source emits an ultrasound signal to the composite glass pane and the ultrasound detector detects the ultrasound signal after it is reflected by the composite glass pane.

13. The device according to claim 1, wherein the control unit includes at least one integrated circuit.

14. The device according to claim 1, wherein the at least one luminescent pigment includes at least one hydroxyalkyl terephthalate with the chemical formula $R_1$—COO—Ph(OH)$_x$—COO—$R_2$, wherein
$R_1$, $R_2$ is an alkyl or allyl radical having 1 to 10 C atoms,
Ph is a phenyl ring,
OH is a hydroxyl group bonded to the phenyl ring, and
x is a whole number from 0 to 4.

15. The device according to claim 1, wherein an antireflective coating is arranged on a surface of the first pane facing the laser projector, the antireflective coating comprising a layer containing a porous silicon dioxide.

16. A method for generating a display image on a composite glass pane, comprising:
directing a laser radiation of a laser via an optical system of a laser projector at a composite glass pane containing at least one luminescent pigment and transmitting a projector ON signal by the laser projector to a control unit when the laser radiation leaves the laser projector;
transmitting a photodetector ON signal by a photodetector to the control unit when a luminescent radiation of the at least one luminescent pigment from a region of the composite glass pane accessible to the radiation of the laser is detected, wherein the luminescent radiation has a different wavelength than the laser radiation, wherein the photodetector is positioned and aligned such that luminescent radiation front at least an entire region of the composite glass pane accessible to the laser radiation can be detected, wherein a wavelength range detected by the photodetector is adapted to a wavelength range of the luminescent radiation of the at least one luminescent pigment by a spectral filter in front of an active surface of the photodetector, and
interrupting an emission of radiation via the control unit from the laser projector when the projector ON signal is received and, at the same time, no photodetector ON signal is received by the control unit.

17. The method according to claim 16, wherein
the radiation is directed at regular time intervals at a predefined position, in an edge region of the region accessible to the radiation,
the photodetector includes a camera with a two-dimensional image sensor, the camera configured to monitor occurrences of a regular luminescent signal from the predefined position on the composite pane, and
the control unit interrupts the emission of laser radiation from the laser projector when a regular luminescent signal from the predefined position is not detected on the composite glass pane.

18. The method according to claim 16, wherein
the radiation is directed at regular time intervals at a predefined position within the laser projector,
the laser projector includes a photodetector, the photodetector configured to monitor occurrences of a regular radiation signal, and
the control unit interrupts the emission of the laser radiation from the laser projector when the regular radiation signal is not detected by the photodetector.

19. A method comprising:
using the device for generating the display image on the composite glass pane according to claim 1 as a transparent display in buildings, motor vehicles, airplanes, helicopters, and/or watercraft.

* * * * *